United States Patent
Kim et al.

(10) Patent No.: US 12,318,819 B2
(45) Date of Patent: Jun. 3, 2025

(54) EXHAUST ASSEMBLY, AND LIQUID PROCESSING APPARATUS AND SUBSTRATE PROCESSING EQUIPMENT INCLUDING THE SAME

(71) Applicant: SEMES CO., LTD., Cheonan-si (KR)

(72) Inventors: Kyung Min Kim, Daegu (KR); In Hwang Park, Cheonan-si (KR); Joo Jib Park, Asan-si (KR); Hyun Jin Yang, Suncheon-si (KR); Ji Hyeong Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 405 days.

(21) Appl. No.: 17/896,782

(22) Filed: Aug. 26, 2022

(65) Prior Publication Data

US 2023/0076790 A1 Mar. 9, 2023

(30) Foreign Application Priority Data

Sep. 6, 2021 (KR) .................. 10-2021-0118159

(51) Int. Cl.
*B08B 3/02* (2006.01)
*B08B 3/08* (2006.01)
*B08B 13/00* (2006.01)
*B08B 15/04* (2006.01)
*H01L 21/67* (2006.01)
*H01L 21/677* (2006.01)

(52) U.S. Cl.
CPC ............. *B08B 15/04* (2013.01); *B08B 3/022* (2013.01); *B08B 3/08* (2013.01); *B08B 13/00* (2013.01); *H01L 21/67017* (2013.01); *H01L 21/6719* (2013.01); *H01L 21/67196* (2013.01); *H01L 21/67742* (2013.01)

(58) Field of Classification Search
None
See application file for complete search history.

(56) References Cited

U.S. PATENT DOCUMENTS

2012/0318301 A1* 12/2012 Higashijima ....... H01L 21/6719
134/95.1

* cited by examiner

*Primary Examiner* — Levon J Shahinian

(57) ABSTRACT

According to an embodiment of the present invention, there are provided an exhaust assembly capable of uniformly forming an air flow in an exhaust step of discharging a gas to the outside, and a liquid processing apparatus and substrate processing equipment including the exhaust assembly. According to the present invention, the exhaust assembly that discharges a gas generated in a substrate processing process includes at least two or more intake ports into which the gas flows, a body portion that communicates with the intake ports and provides symmetrical paths for discharging the gas, a guide portion that is installed to guide a flow of the gas at the body portion, and an exhaust port from which the gas is discharged. The guide portion includes a flow guide that is installed to be adjacent to at least one of the intake ports and guides a direction of the gas to equally divide the flow of the gas, and a flow-rate guide that is installed around the intake port most adjacent to the exhaust port among the intake ports and is formed to reduce a cross-sectional area of a flow path of the gas.

7 Claims, 4 Drawing Sheets

EXHAUST ASSEMBLY, AND LIQUID PROCESSING APPARATUS AND SUBSTRATE PROCESSING EQUIPMENT INCLUDING THE SAME

CROSS REFERENCE TO RELATED APPLICATION

The present application claims priority to Korean Patent Application No. 10-2021-0118159, filed Sep. 6, 2021, the entire contents of which is incorporated by reference herein for all purposes.

BACKGROUND OF THE INVENTION

Field of the Invention

The present invention relates to an exhaust assembly and a liquid processing apparatus and substrate processing equipment including the exhaust assembly, and more particularly, to an exhaust assembly that discharges a gas generated from a substrate processing process, and a liquid processing apparatus and substrate processing equipment including the exhaust assembly.

Description of the Related Art

A semiconductor (or display) manufacturing process is a process for manufacturing a semiconductor element on a substrate (for example, wafer). The semiconductor manufacturing process includes, for example, exposure, deposition, etching, ion implantation, and cleaning. In particular, a liquid processing process such as a process of removing particles on a substrate by supplying a processing liquid onto the substrate or a process of forming a liquid film on the substrate may be performed.

In such a liquid processing process, a gas may be generated due to a chemical reaction on the substrate, and the gas remaining after a specific process may influence the next process. Thus, an exhaust system that discharges the remaining gas to the outside may be configured.

When, in the process of discharging the gas to the outside, an air flow is not formed uniformly, and the air pressure is high or the air flow is stagnant in a specific section, the overall gas discharge step may not be smoothly performed, such as the generation of fume.

SUMMARY OF THE INVENTION

According to embodiments of the present invention, there are provided an exhaust assembly capable of uniformly forming an air flow in an exhaust step of discharging a gas to the outside, and a liquid processing apparatus and substrate processing equipment including the exhaust assembly.

The problems to be solved of the present invention are not limited to those described above, and other problems not described will be clearly understood by those skilled in the art from the following description.

According to an aspect of the present invention, an exhaust assembly that discharges a gas generated in a substrate processing process, includes a plurality of intake ports into which the gas flows, a number of the plurality of intake ports being an integer number equal to or greater than two, a body portion connected to the plurality of intake ports and provides symmetrical paths for discharging the gas received from the plurality of intake ports, an exhaust port connected to the body portion and discharging the gas within the body portion, and a guide portion installed within the body portion and configured to guide a flow of the gas within the body portion toward the exhaust port. The guide portion includes a flow guide that is installed to be adjacent to at least one intake port of the plurality of intake ports and guides a direction of the gas to equally divide the flow of the gas, and a flow-rate guide that is installed around a first intake port, most adjacent to the exhaust port, among the plurality of intake ports and is formed to reduce a cross-sectional area of a flow path of the gas.

According to an aspect of the present invention, a liquid processing apparatus includes a chuck on which a substrate is mounted, a bowl for collecting a chemical liquid dispersed from the substrate on the chuck, and an exhaust assembly that discharges a gas generated in a process of processing the substrate on the chuck. The exhaust assembly comprises a plurality of intake ports into which the gas flows, a number of the plurality of intake ports being an integer number equal to or greater than two, a body portion connected to the plurality of intake ports and provides symmetrical paths for discharging the gas received from the plurality of intake ports, an exhaust port connected to the body portion and discharging the gas within the body portion, and a guide portion installed within the body portion and configured to guide a flow of the gas within the body portion toward the exhaust port. The guide portion comprises a flow guide that is installed to be adjacent to at least one intake port of the plurality of intake ports and guides a direction of the gas to equally divide the flow of the gas, and a flow-rate guide that is installed around a first intake port, most adjacent to the exhaust port, among the plurality of intake ports and is formed to reduce a cross-sectional area of a flow path of the gas.

According to an aspect of the present invention, substrate processing equipment includes a load port on which a carrier in which a substrate is stored is mounted, an index robot that conveys the substrate within the carrier, and a process processing unit including a load lock chamber that temporarily loads the substrate, a transport chamber that conveys the substrate from the load lock chamber, and a liquid processing apparatus that performs a liquid processing process on the substrate. The liquid processing apparatus includes a chuck on which a substrate is mounted, a bowl for collecting a chemical liquid dispersed from the substrate on the chuck, and an exhaust assembly that discharges a gas generated in a process of processing the substrate on the chuck. The exhaust assembly comprises a plurality of intake ports into which the gas flows, a number of the plurality of intake ports being an integer number equal to or greater than two, a body portion connected to the plurality of intake ports and provides symmetrical paths for discharging the gas received from the plurality of intake ports, an exhaust port connected to the body portion and discharging the gas within the body portion, and a guide portion installed within the body portion and configured to guide a flow of the gas within the body portion toward the exhaust port. The guide portion comprises a flow guide that is installed to be adjacent to at least one intake port of the plurality of intake ports and guides a direction of the gas to equally divide the flow of the gas, and a flow-rate guide that is installed around a first intake port, most adjacent to the exhaust port, among the plurality of intake ports and is formed to reduce a cross-sectional area of a flow path of the gas.

According to the present invention, it is possible to uniformly form an air flow in an exhaust step by the body portion that provides the symmetrical paths for discharging the gas, the flow guide that guides the direction of the gas to equally divide the flow of the gas, and the flow-rate guide that is installed around the intake port most adjacent to the exhaust port and guides the flow rate of the gas.

The effects of the present invention are not limited to the effects described above, and effects not mentioned can be clearly understood by those skilled in the art from the following description.

BRIEF DESCRIPTION OF THE DRAWINGS

The above and other objectives, features, and other advantages of the present disclosure will be more clearly understood from the following detailed description taken in conjunction with the accompanying drawings, in which.

DESCRIPTION OF THE EMBODIMENTS

Hereinafter, embodiments of the present disclosure will be described in detail with reference to the accompanying drawings to be easily implemented by those skilled in the art. The present disclosure may be implemented in various different forms and is not limited to the embodiments described herein.

In order to clearly describe the present disclosure, parts irrelevant to the description are omitted, and the same or similar components are denoted by the same reference signs throughout the specification.

In addition, in various embodiments, components having the same configuration will be described only in the representative embodiment with the same reference signs, and only configurations different from the representative embodiment will be described in other embodiments.

In the entire specification, a phase that a portion is "connected (or coupled) to" another portion includes not only a case of "being directly connected (coupled)" but also a case of "being indirectly connected (coupled) with other portions interposed therebetween". In addition, a phase that a portion "includes" a certain component means that other components may be further included, rather than excluding other components, unless otherwise stated.

Unless defined otherwise, all terms used herein, including technical or scientific terms, have the same meaning as commonly understood by those skilled in the art. Terms such as those defined in commonly used dictionaries should be interpreted as having a meaning consistent with the meaning in the context of the related art, and should not be interpreted in an ideal or excessively formal meaning unless explicitly defined in the present application.

Figure 1:
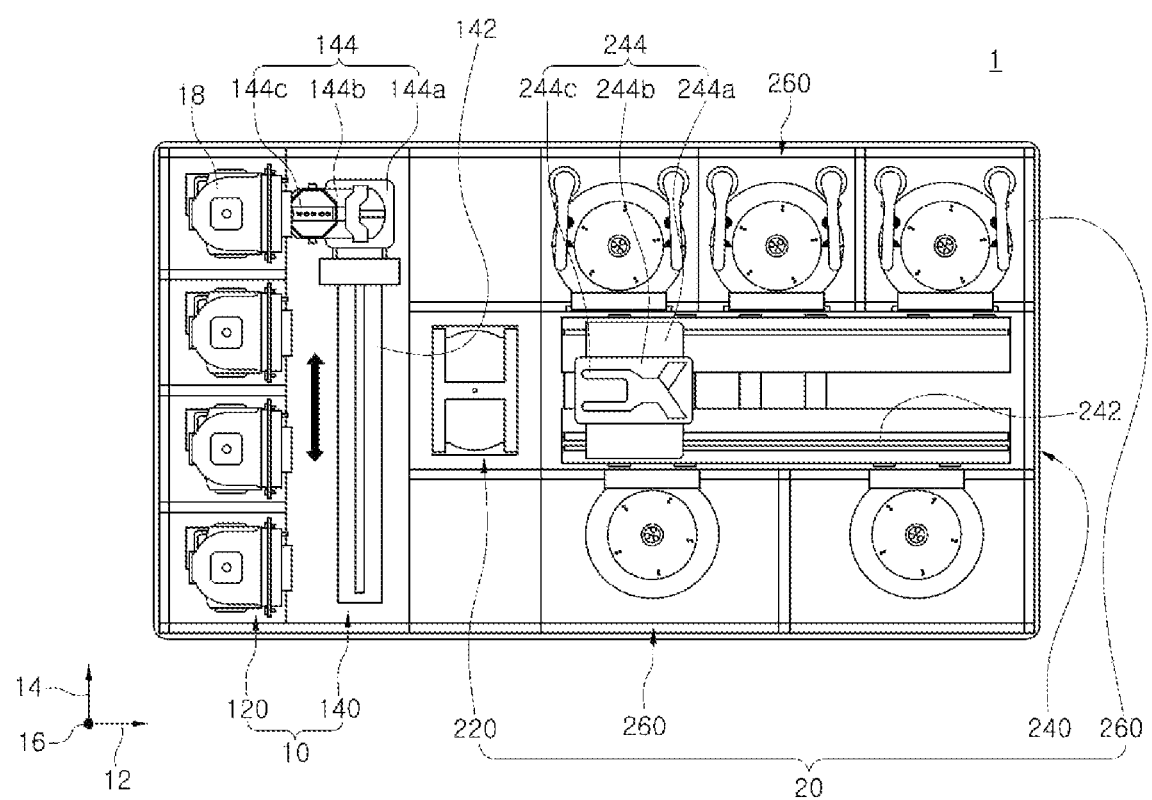
FIG. 1 illustrates a schematic structure of substrate processing equipment to which the present invention is applicable.

FIG. 1 illustrates a schematic structure of substrate processing equipment 1 to which the present invention is applicable. With reference to FIG. 1, the substrate processing equipment 1 includes an index unit 10 and a process processing unit 20.

The index unit 10 may include a load port 120 and an index chamber 140. The load port 120, the index chamber 140, and the process processing unit 20 may be arranged in a line in order. A direction in which the load port 120, the index chamber 140, and the process processing unit 20 are arranged is referred to as a first direction 12 below. A direction perpendicular to the first direction 12 when viewed from the top is referred to as a second direction 14 below, and a direction perpendicular to a plane including the first direction 12 and the second direction 14 is referred to as a third direction 16 below.

A carrier C in which a substrate is stored may be mounted on the load port 120. A plurality of load ports 120 may be provided and may be arranged in a line along the second direction 14. FIG. 1 illustrates that four load ports 120 are provided. The number of load ports 120 may increase or decrease depending on conditions such as process efficiency and footprint of the process processing unit 20. A front opening unified pod (FOUP) may be used as the carrier C.

The index chamber 140 is located between the load port 120 and the process processing unit 20. The index chamber 140 has a rectangular parallelepiped shape including a front panel, a rear panel, and both side panels. In the index chamber 140, an index robot 144 that conveys a substrate between the carrier C mounted on the load port 120 and a load lock chamber 220 is provided. Although not illustrated, the index chamber 140 may include a controlled air flow system such as vents and laminar flow systems, in order to prevent introduction of particles to the internal space.

The process processing unit 20 may include the load lock chamber 220, a transport chamber 240, and a liquid processing chamber 260. The transport chamber 240 may be disposed so that the longitudinal direction of the transport chamber is parallel to the first direction 12. Liquid processing chambers 260 may be respectively disposed on one side and the other side of the transport chamber 240 in the second direction 14.

Some of the liquid processing chambers 260 may be arranged in the longitudinal direction of the transport chamber 240. Some of the liquid processing chambers 260 may be arranged to be stacked.

That is, the liquid processing chambers 260 may be arranged on one side of the transport chamber 240 in an arrangement of A×B (A and B are natural numbers of 1 or more). Here, A indicates the number of liquid processing chambers 260 provided in a line in the first direction 12, and B indicates the number of liquid processing chambers 260 provided in a line in the third direction 16.

The load lock chamber 220 is disposed between the index chamber 140 and the transport chamber 240. The load lock chamber 220 provides a space for temporarily loading the substrate before the substrate is conveyed between the transport chamber 240 and the index chamber 140. The load lock chamber 220 is provided with a slot (not illustrated) in which the substrate is placed, and a plurality of slots (not illustrated) are provided to be spaced from each other in the third direction 16. In the load lock chamber 220, a surface facing the index chamber 140 and a surface facing the transport chamber 240 may be provided in an open form.

The transport chamber 240 may convey the substrate between the load lock chamber 220 and the liquid processing chambers 260. The transport chamber 240 may be provided with a guide rail 242 and a main robot 244. The guide rail 242 is disposed so that the longitudinal direction of the guide rail is parallel to the first direction 12. The main robot 244 is installed on the guide rail 242 and is provided to be movable on the guide rail 242 along the first direction 12 in a straight line. The main robot 244 includes a drive unit 244a configured to move along the guide rail 242, a robot body portion 244b configured to be coupled to the drive unit 244a and move, and a robot hand portion 244c that is coupled to the robot body portion 244*b* to convey the substrate while supporting the lower portion of the substrate.

An apparatus that performs the liquid processing process, for example, a cleaning process, on the substrate may be provided in the liquid processing chamber 260. A liquid processing apparatus according to the embodiment of the present invention may be provided as a component of the liquid processing chamber 260. For example, the cleaning process may be a process of cleaning the substrate, stripping, and removing organic residue by using processing fluids containing an alcohol component. A substrate processing apparatus provided in each liquid processing chamber 260 may have a different structure depending on the type of cleaning process to be performed. Optionally, the liquid processing chambers 260 may be divided into a plurality of groups, the substrate processing apparatus provided in the liquid processing chambers 260 belonging to the same group may have the same structure, and the substrate processing apparatus provided in the liquid processing chambers 260 belonging to the different groups may have the different structures.

The liquid processing apparatus according to the present invention includes a chuck 310 on which a substrate is mounted, a bowl 320 for collecting a chemical liquid dispersed from the substrate, and an exhaust assembly 400 that discharges a gas generated in a process of processing the substrate. Although not specifically illustrated, the liquid processing chamber 260 may include a nozzle for supplying the chemical liquid onto the substrate and a drain portion that discharges the chemical liquid.

The chuck 310 is provided in a circular plate shape, and support the substrate upwardly to make it possible to perform the process of processing the substrate. The chuck 310 may be configured to be rotatable. When the substrate rotates together by the rotation of the chuck 310 and the chemical liquid is supplied to the center of the substrate, the chemical liquid may be supplied from the center to the periphery of the substrate by a centrifugal force. A support pin 312 that supports the substrate upwardly and a chuck pin 314 that comes into contact with the outer circumferential portion of the substrate to prevent deviation of the substrate may be configured on the upper surface of the chuck 310.

The bowl 320 may block dispersion of the chemical liquid supplied onto the substrate to other apparatuses of the liquid processing chamber 260 and collect and discharge the chemical liquid. The bowl 320 may be provided in a cylindrical shape having an opened upper portion and be configured to ascend and descend to collect the chemical liquid. Meanwhile, intake ports 410 may be arranged around the bowl 320. The intake ports 410 may introduce a gas containing the residue generated during processing of the substrate on the chuck to an exhaust apparatus illustrated in FIGS. 3 and 4.

Figure 2:
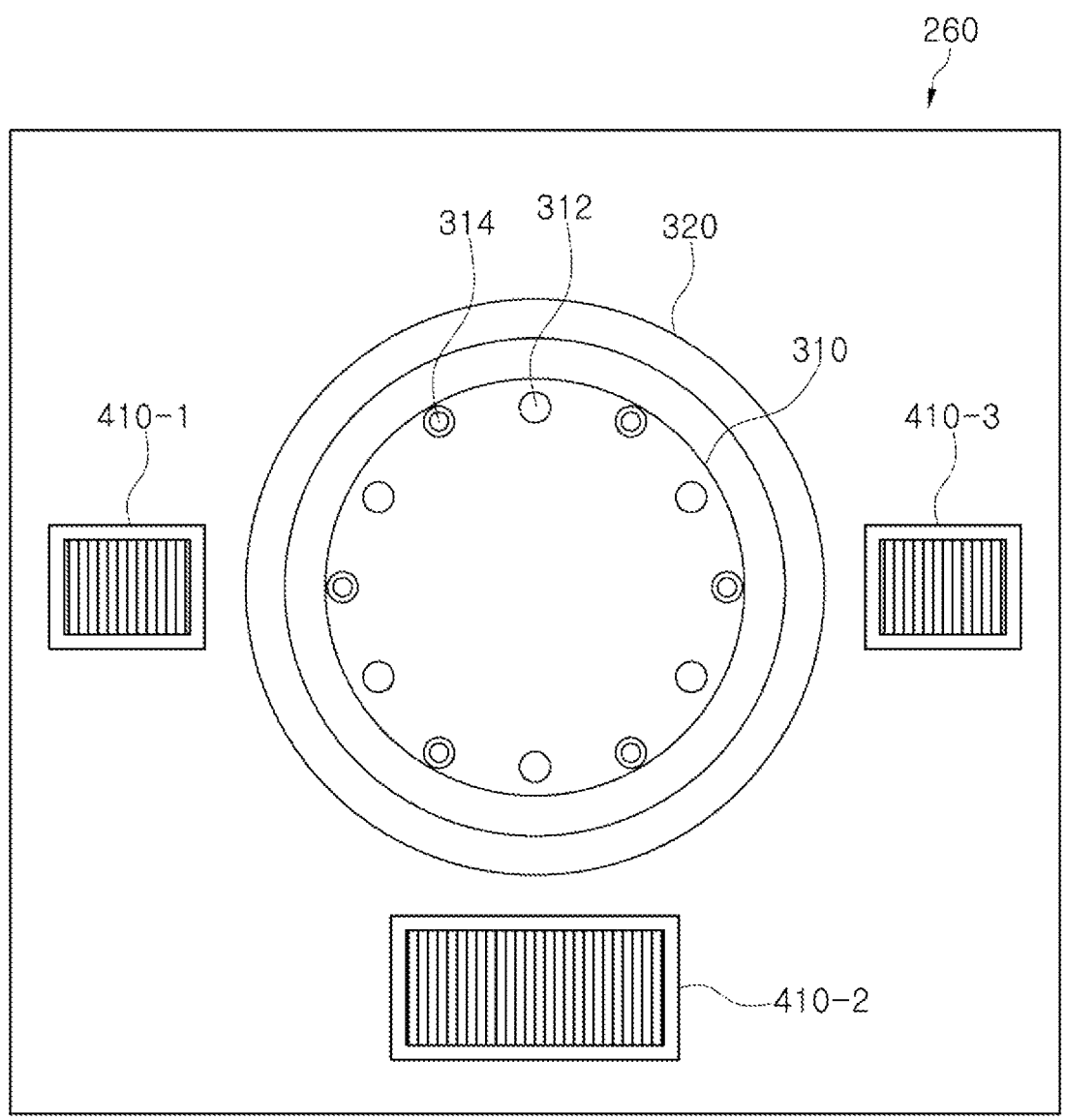
FIG. 2 illustrates a schematic structure of a liquid processing apparatus to which the present invention is applicable.

As illustrated in FIG. 2, the intake ports 410 may be asymmetrically arranged around the bowl 320. As illustrated in FIG. 2, a first intake port 410-1 may be disposed on one side (nine o'clock position) of the bowl 320, a second intake port 410-2 may be disposed on the lower side (six o'clock position) of the bowl, and a third intake port 410-3 may be disposed on an opposite side (three o'clock position) of the first intake port 410-1 based on the bowl 320. Such an asymmetrical arrangement of the intake ports 410 may be caused by the durable structure of the liquid processing chamber 260. In addition, the area of each intake port 410 may be different.

Meanwhile, a general exhaust apparatus may be configured in a form of a conduit for simply guiding a gas from the intake port to an exhaust port. In many cases, a conduit is configured asymmetrically for space efficiency. When the conduit is configured asymmetrically in this manner, the gas may not flow uniformly in a specific region and stagnation may occur. In addition, when the intake ports are asymmetrically famed as illustrated in FIG. 2, the pressure when the gas flows into the intake port is different. In particular, the gas may be concentrated on the intake port located closest to the exhaust port, and thus the pressure may be excessively high in the specific region. Such an asymmetrical pressure distribution may cause problems such as a decrease in overall exhaust efficiency and the accumulation of foreign materials such as fumes in the exhaust apparatus. Thus, the present invention has been devised to induce predetermined pressure of a gas in a path through which the gas flows in the exhaust apparatus.

The exhaust assembly 400 exhausts a gas containing the residue generated during processing of the substrate, to the outside. According to the present invention, the exhaust assembly 400 includes at least two or more intake ports 410 into which the gas flows, a body portion 420 that communicates with the intake ports 410 and provides symmetrical paths for discharging the gas, a guide portion 430 that is installed to guide the flow of the gas at the body portion 420, and an exhaust port 440 for discharging the gas.

According to the present invention, the guide portion 430 may include a flow guide 432 that is installed to be adjacent to at least one of the intakes ports and guides the direction of the gas to equally divide the flow of the gas, and a flow-rate guide 434 that is installed around the intake port being the most adjacent to the exhaust port 440 (for example, third intake port 410-3) among the intake ports 410 and is formed to narrow the flow path of the gas.

As described in the embodiment of the present invention, it is possible to bidirectionally keep the air flow constant by providing the flow guide 432 that guides the direction of the gas to equally divide the flow of the gas at the body portion 420 that provides symmetrical paths for discharging the gas. In addition, it is possible to prevent an occurrence of a situation in which the gas is concentrated on the specific intake port to increase the pressure, by providing the flow-rate guide 434 that is formed to narrow the flow path of the gas, in the vicinity of the intake port being most adjacent to the exhaust port 440 (for example, third intake port 410-3) among the intake ports 410.

As described above, the intake ports 410 may be asymmetrically arranged around the space (chuck 310 and bowl 320) in which the substrate processing process is performed. For example, as illustrated in FIG. 2, the first intake port 410-1 may be disposed on one side (nine o'clock position) of the bowl 320, the second intake port 410-2 may be disposed on the lower side (six o'clock position) of the bowl, and the third intake port 410-3 may be disposed on an opposite side (three o'clock position) of the first intake port 410-1 based on the bowl 320. Such an asymmetrical arrangement of the intake ports 410 may be caused by the durable structure of the liquid processing chamber 260. In addition, the area of each intake port 410 may be different.

Figure 3:
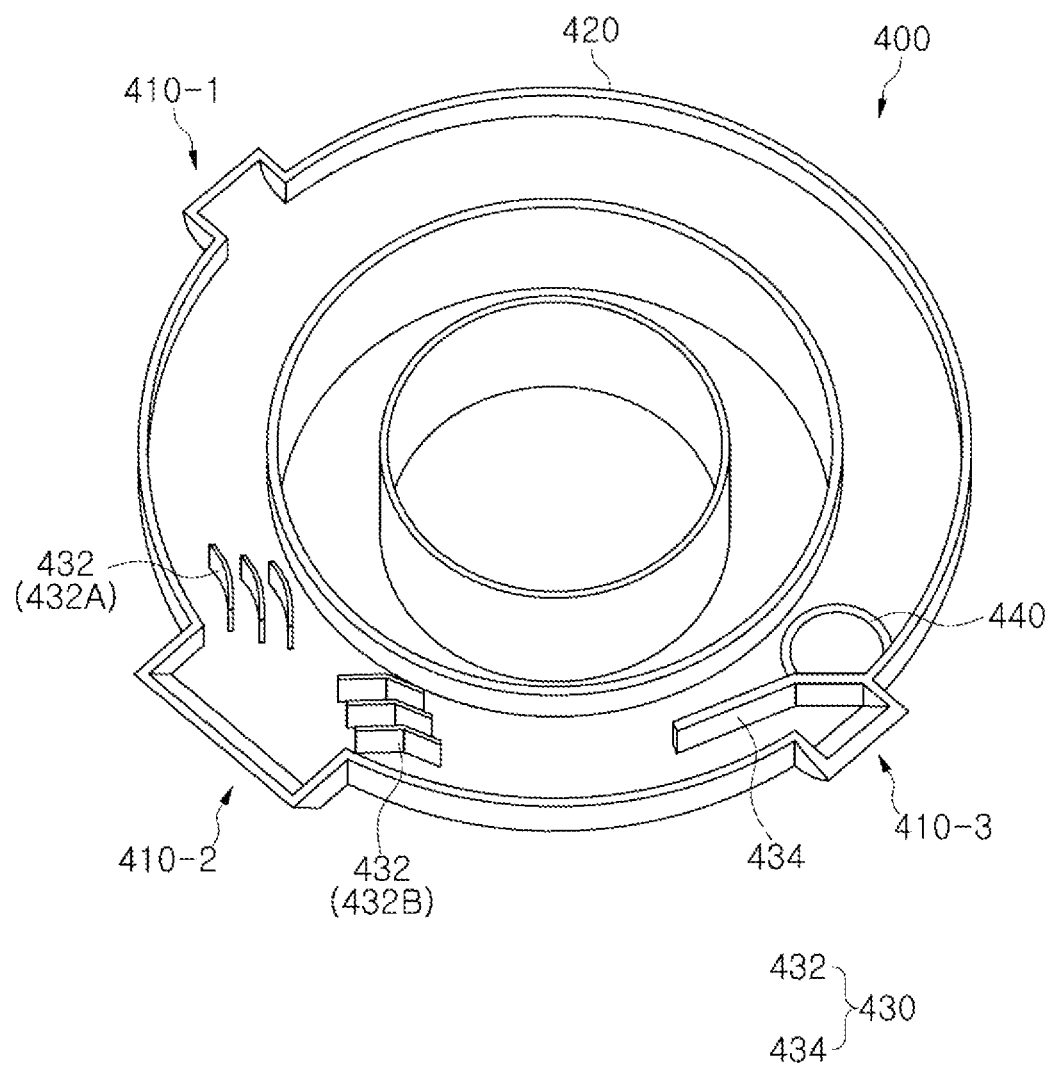
FIGS. 3 and 4 illustrate a schematic structure of an exhaust assembly according to an embodiment of the present invention.
Figure 4:
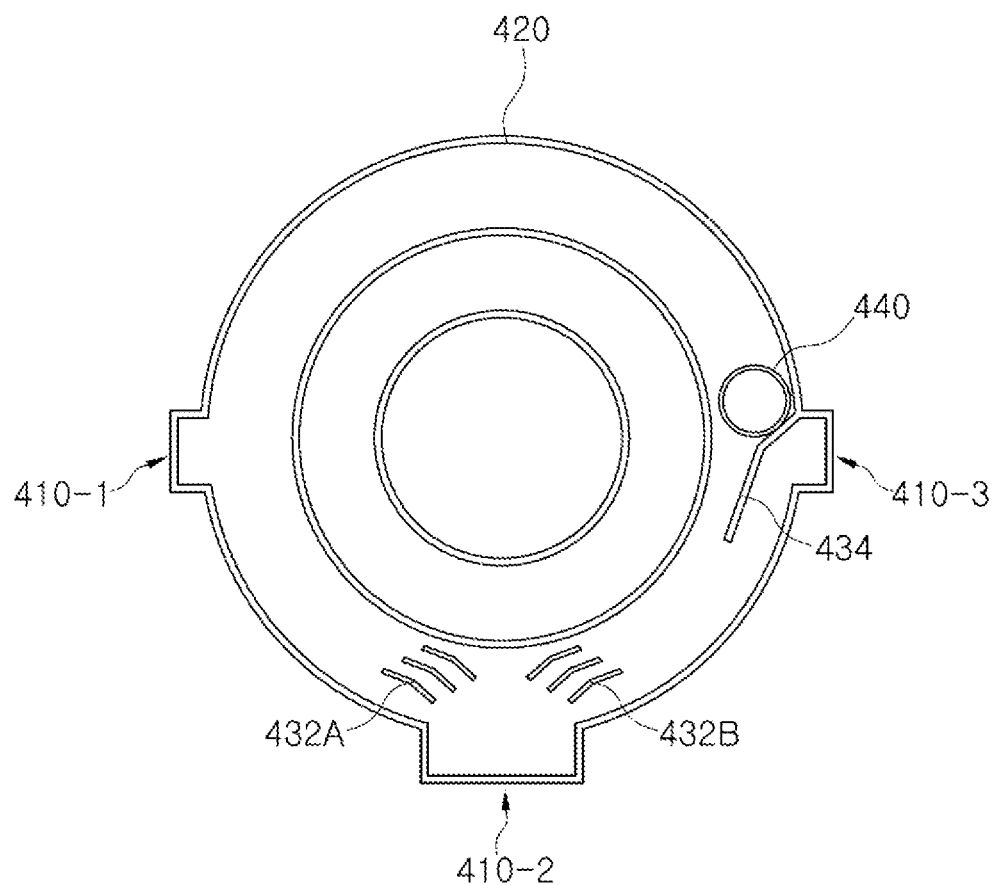

According to the present invention, the body portion 420 may be formed such that the gas flowing into the body portion through the intake port 410 is allowed to flow bidirectionally toward the exhaust port. With reference to FIGS. 3 and 4, the body portion may be formed such that a circular opening formed at the center provides a circular path formed at the center. The body portion 420 is configured to communicate with each intake port 410 and cause the flow flowing into the body portion through the intake port 410 to circularly flows. The body portion 420 is configured to provide a bidirectional exhaust path. The gas flowing through the intake port 410 flows clockwise or counterclockwise.

According to the present invention, the flow guide 432 may include a first flow guide 432A and a second flow guide 432B. The first flow guide 432A guides the flow of the gas in the vicinity of the intake port (for example, second intake port 410-2), in the first direction of the body portion 420 (for example, clockwise). The second flow guide 432B guides the flow of the gas in the vicinity of the intake port (for example, second intake port 410-2), in the second direction of the body portion 420 (for example, counterclockwise). For example, the first flow guide 432A and the second flow guide 432B may include partitions spaced from each other at a predetermined distance.

The partitions of the first flow guide 432A and the second flow guide 432B illustrated in FIGS. 3 and 4 may guide the gas flowing through the second intake port 420-2 to flow bidirectionally and uniformly. The first flow guide 432A and the second flow guide 432B may be preferably arranged around the intake port located at the center, for example, the second intake port 420-2. Preferably, the partitions of the first flow guide 432A and the second flow guide 432B may be configured in a form of a guide vane that is curved to be allowed to flow without a stagnant section.

According to the present invention, the flow-rate guide 434 may include the partition that narrows a path for the gas flowing, in the vicinity of the intake port (for example, third intake port 410-3) most adjacent to the exhaust port 440 among the intake ports 410. When there is no flow-rate guide 434 having a partition form as illustrated in FIGS. 3 and 4, the gas having a flow rate more than the flow rate of the first intake port 410-1 having the same area flows into the third intake port 410-3 most adjacent to the exhaust port 440, and thus the high pressure may be maintained. In this case, the flow rate becomes unbalanced in the exhaust assembly 400. Thus, if the flow rate of the gas flowing into the third intake port 410-3 is reduced by configuring the flow-rate guide 434 having a partition shape as illustrated in FIGS. 3 and 4, it is possible to maintain the flow rate balance between the first intake port 410-1 and the third intake port 410-3.

According to the present invention, the exhaust assembly 400 may be provided as the component of the liquid processing apparatus described above. The liquid processing apparatus according to the present invention includes the chuck 310 on which a substrate is mounted, the bowl 320 for collecting the chemical liquid dispersed from the substrate, and the exhaust assembly 400 that discharges a gas generated in the process of processing the substrate. The exhaust assembly 400 according to the present invention includes at least two or more intake ports 410, the body portion 420 that communicates with the intake ports 410 and provides the symmetrical paths for discharging the gas, the guide portion 430 that is installed to guide the flow of the gas at the body portion 420, and the exhaust port 440 for discharging the gas. The guide portion 430 may include the flow guide 432 that is installed to be adjacent to at least one of the intake ports 410 and guides the direction of the gas to equally divide the flow of the gas, and the flow-rate guide 434 that is installed around the intake port 410 most adjacent to the exhaust port 440 among the intake ports 410 and is famed to reduce the cross-sectional area of the flow path of the gas.

The liquid processing apparatus and the exhaust assembly 400 according to the present invention may be provided as a component of the substrate processing equipment described above. The substrate processing equipment 1 according to the present invention includes the index unit 10 including the load port 120 on which the carrier 18 in which a substrate is stored is mounted, and the index robot 144 that conveys the substrate, and the process processing unit 20 including the load lock chamber 220 that temporarily loads the substrate, the transport chamber that conveys the substrate from the load lock chamber 220, and the liquid processing apparatus that performs the liquid processing process on the substrate. The liquid processing apparatus according to the present invention includes the chuck 310 on which a substrate is mounted, the bowl 320 for collecting the chemical liquid dispersed from the substrate, and the exhaust assembly 400 that discharges a gas generated in the process of processing the substrate. The exhaust assembly 400 according to the present invention includes at least two or more intake ports 410, the body portion 420 that communicates with the intake ports 410 and provides the symmetrical paths for discharging the gas, the guide portion 430 that is installed to guide the flow of the gas at the body portion 420, and the exhaust port 440 for discharging the gas. The guide portion 430 may include the flow guide 432 that is installed to be adjacent to at least one of the intake ports 410 and guides the direction of the gas to equally divide the flow of the gas, and the flow-rate guide 434 that is installed around the intake port 410 most adjacent to the exhaust port 440 among the intake ports 410 and is formed to reduce the cross-sectional area of the flow path of the gas.

It will be apparent that the present embodiment and the drawings attached to this specification just clearly represent a part of the technical spirit included in the present invention, and all modification examples and specific embodiments that can be easily inferred by those skilled in the art within the scope of the technical spirit contained in the specification and drawings of the present invention are included in the scope of the present invention.

Therefore, the spirit of the present invention should not be limited to the described embodiments, and not only the claims to be described later, but also all those that have equal or equivalent modifications to the claims will be said to belong to the scope of the spirit of the present invention.

What is claimed is:

1. An exhaust assembly that discharges a gas generated in a substrate processing process, the exhaust assembly comprising:
a plurality of intake ports into which the gas flows, a number of the plurality of intake ports being an integer number equal to or greater than two;
a body portion connected to the plurality of intake ports and provides symmetrical paths for discharging the gas received from the plurality of intake ports;
an exhaust port connected to the body portion and discharging the gas within the body portion; and
a guide portion installed within the body portion and configured to guide a flow of the gas within the body portion toward the exhaust port,
wherein the guide portion comprises:
a flow guide that is installed to be adjacent to at least one intake port of the plurality of intake ports and guides a direction of the gas to equally divide the flow of the gas; and
a flow-rate guide that is installed around a first intake port, most adjacent to the exhaust port, among the plurality of intake ports and is formed to reduce a cross-sectional area of a flow path of the gas.

2. The exhaust assembly according to claim 1,
wherein the plurality of intake ports are asymmetrically arranged around a space in which the substrate processing process is performed.

3. The exhaust assembly according to claim 1,
wherein the body portion is configured to bidirectionally flow the gas received from the plurality of intake ports toward the exhaust port.

4. The exhaust assembly according to claim 3,
wherein the body portion includes a circular opening formed at the center of the body portion to provide a circular flow path for the gas received from the plurality of intake ports.

5. The exhaust assembly according to claim 1,
wherein the flow guide comprises:
   a first flow guide that is adjacent to a first side of the at least one intake port and guides the flow of the gas in a first direction of the body portion; and
   a second flow guide that is adjacent to a second side, opposite to the first side, of the at least one intake port and guides the flow of the gas in a second direction of the body portion.

6. The exhaust assembly according to claim 5,
wherein each of the first flow guide and the second flow guide comprises a plurality of partitions spaced apart from each other at a predetermined distance.

7. The exhaust assembly according to claim 1,
wherein the flow-rate guide comprises a partition extending from a first side of the first intake port toward the flow guide, thereby narrowing a path through which the gas flows.

\* \* \* \* \*